(12) United States Patent
Koker et al.

(10) Patent No.: US 9,075,741 B2
(45) Date of Patent: Jul. 7, 2015

(54) DYNAMIC ERROR HANDLING USING PARITY AND REDUNDANT ROWS

(75) Inventors: Altug Koker, El Dorado Hills, CA (US); Shailesh Shah, Folsom, CA (US); Aditya Navale, Folsom, CA (US); Murali Ramadoss, Folsom, CA (US); Satish K. Damaraju, El Dorado hills, CA (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 13/327,845

(22) Filed: Dec. 16, 2011

(65) Prior Publication Data
US 2013/0159820 A1   Jun. 20, 2013

(51) Int. Cl.
| | |
|---|---|
| G06F 11/00 | (2006.01) |
| G06F 11/10 | (2006.01) |
| H03M 13/09 | (2006.01) |
| H04L 1/00 | (2006.01) |
| H03M 13/11 | (2006.01) |

(52) U.S. Cl.
CPC ........ *G06F 11/1048* (2013.01); *G06F 11/1008* (2013.01); *H04L 1/0057* (2013.01); *G06F 11/1076* (2013.01); *G06F 11/10* (2013.01); *H03M 13/11* (2013.01); *H03M 13/09* (2013.01)

(58) Field of Classification Search
CPC ............ G06F 11/1008; G06F 11/1076; G06F 11/1032; G06F 11/10; G06F 2201/388; G06F 2201/835; G06F 17/30353; H03M 13/11; H04L 12/2684; H04L 43/106; H04L 2463/121; H04L 1/0057

USPC ............. 714/39, 48, 758, 799, 800, 801, 805, 714/804, 38.13

See application file for complete search history.

(56) References Cited

U.S. PATENT DOCUMENTS

| | | | | |
|---|---|---|---|---|
| 4,868,738 | A  * | 9/1989 | Kish et al. | 710/26 |
| 5,345,582 | A | 9/1994 | Tsuchiya | |
| 6,496,947 | B1 * | 12/2002 | Schwarz | 714/30 |
| 7,093,190 | B1 | 8/2006 | Kuslak et al. | |
| 7,200,770 | B2 * | 4/2007 | Hartwell et al. | 714/6.32 |

(Continued)

FOREIGN PATENT DOCUMENTS

| | | |
|---|---|---|
| EP | 0378349 B1 | 8/1894 |
| EP | 0423933 A2 | 4/1991 |
| WO | 2013/090520 A1 | 6/2013 |

OTHER PUBLICATIONS

International Search Report and Written Opinion received for PCT Patent Application No. PCT/US2012/069411, mailed on Mar. 11, 2013, 10 pages.

(Continued)

*Primary Examiner* — Albert Decady
*Assistant Examiner* — Osman Alshack
(74) *Attorney, Agent, or Firm* — Thomas R. Lane

(57) ABSTRACT

Embodiments of an invention for dynamic error correction using parity and redundant rows are disclosed. In one embodiment, an apparatus includes a storage structure, parity logic, an error storage space, and an error event generator. The storage structure is to store a plurality of data values. The parity logic is to detect a parity error in a data value stored in the storage structure. The error storage space is to store an indication of a detection of the parity error. The error event generator is to generate an event in response to the indication of the parity error being stored in the error storage space.

4 Claims, 3 Drawing Sheets

(56) References Cited

U.S. PATENT DOCUMENTS

| | | | |
|---|---|---|---|
| 7,512,772 B2* | 3/2009 | Gschwind et al. | 712/227 |
| 7,562,265 B2* | 7/2009 | Azevedo et al. | 714/55 |
| 7,761,660 B1* | 7/2010 | Gavarre et al. | 711/114 |
| 2002/0016942 A1* | 2/2002 | MacLaren et al. | 714/718 |
| 2003/0023932 A1 | 1/2003 | Arndt et al. | |
| 2008/0148104 A1* | 6/2008 | Brinkman et al. | 714/43 |
| 2009/0037781 A1* | 2/2009 | Abella et al. | 714/49 |
| 2009/0037783 A1* | 2/2009 | Vera et al. | 714/54 |
| 2009/0125592 A1* | 5/2009 | Hartwich et al. | 709/206 |
| 2009/0287956 A1* | 11/2009 | Flynn et al. | 714/6 |
| 2010/0005376 A1* | 1/2010 | LaBerge et al. | 714/819 |
| 2011/0170365 A1* | 7/2011 | Nakanishi et al. | 365/200 |
| 2012/0179422 A1* | 7/2012 | Webb et al. | 702/187 |

OTHER PUBLICATIONS

International Preliminary Report on Patentability received for PCT Patent Application No. PCT/US2012/069411, mailed on Jun. 26, 2014, 7 pages.

* cited by examiner

METHOD 200

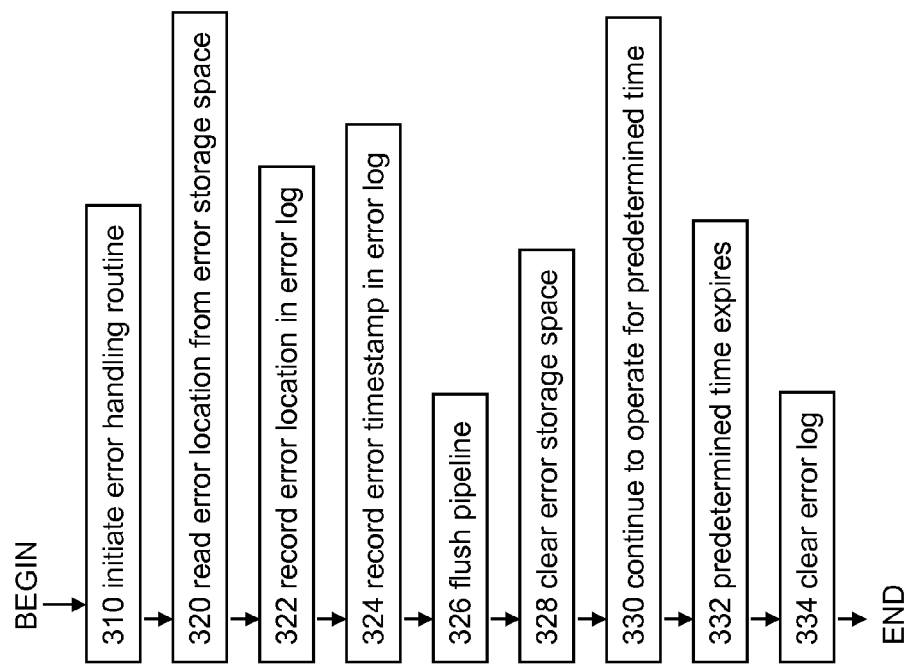

DYNAMIC ERROR HANDLING USING PARITY AND REDUNDANT ROWS

BACKGROUND

1. Field

The present disclosure pertains to the field of information processing, and more particularly, to the field of error detection and correction in information processing systems.

2. Description of Related Art

As improvements in integrated circuit manufacturing technologies continue to provide for denser circuitry, lower operating voltages are being used to reduce power consumption. However, in memory structures such as static random access memory used as cache memory in processors, the combination of larger array sizes and lower operating voltage increases the likelihood of memory cell failure. Therefore, makers and users of these devices are becoming increasingly concerned with error detection and correction. Memory structures may be protected with the addition of parity and/or error-correcting-code (ECC) cells along with hardware to generate and check the parity and ECC values. Parity may provide for error detection which may be insufficient to provide a robust solution to error management. On the other hand, the cost of ECC in terms of die area and pipeline complexity may be too great to provide a desired solution.

BRIEF DESCRIPTION OF THE FIGURES

The present invention is illustrated by way of example and not limitation in the accompanying figures.

FIG. 3 illustrates a method for dynamic error handling according to an embodiment of the present invention.

DETAILED DESCRIPTION

Embodiments of an invention for dynamic error handling using parity and redundant rows are described. In this description, numerous specific details, such as processor and system configurations, may be set forth in order to provide a more thorough understanding of the present invention. It will be appreciated, however, by one skilled in the art, that the invention may be practiced without such specific details. Additionally, some well-known structures, circuits, and other features have not been shown in detail, to avoid unnecessarily obscuring the present invention. For example, a complete description of parity-based error detection is not described, as a number of known approaches may be used in embodiments of the present invention. In this description, "0" (or "zero") and "1" (or "one") may be used to describe the values of binary digits ("bits") of data or other information, where the former may be any voltage or other level that represents a logical "zero" or "off" value, and the latter may be any such level that represents a logical "one" or "on" value.

As described in the background section, storage elements may be added to information storage structures to provide for error detection and/or correction in information processing systems. Embodiments of the present invention may be used for any information storage structure in any information processing system. Embodiments of the present invention may be desirable for memory arrays within a processor, such as a last level cache, because processor and system cost and performance may be particularly sensitive to the size of these data storage structures.

Figure 1:
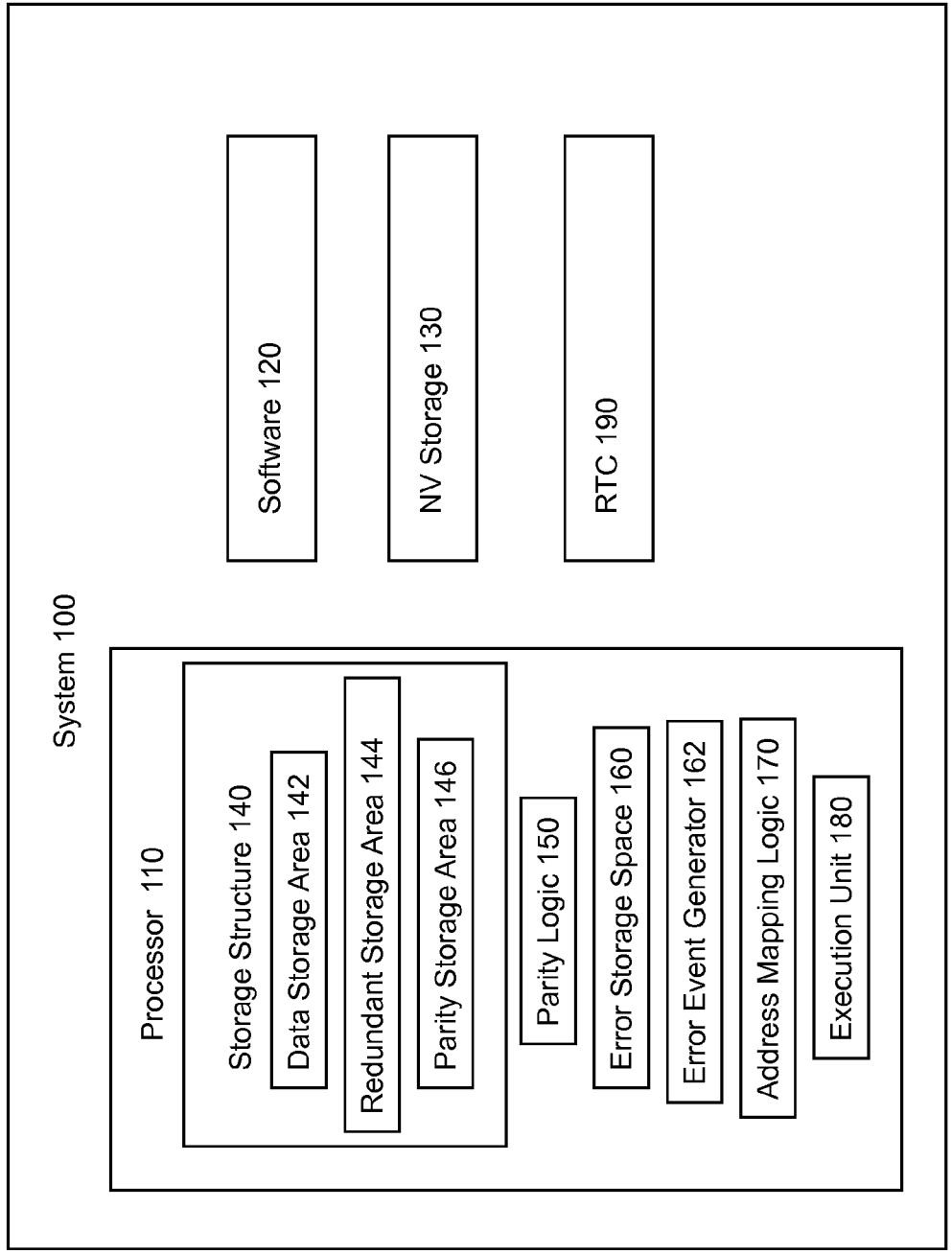
FIG. 1 illustrates an information processing system including dynamic error handling according to an embodiment of the present invention.

FIG. 1 illustrates information processing system 100 including dynamic error handling for a memory array according to an embodiment of the present invention. System 100 includes processor 110, software 120, non-volatile storage 130, and real-time clock 190. System 100 may also include any number of additional processors, devices, storage structures, and/or any other components or elements.

Processor 110 may be any type of processor, including a general purpose microprocessor, such as a processor in the Intel® Core™ Processor Family or other processor family from Intel® Corporation or another company, or a special purpose processor such as a graphics processor or a microcontroller. Processor 110 may include storage structure 140, parity logic 150, error storage space 160, address mapping logic 170, and execution unit 180.

Software 120 may be any software installed and/or running on system 100, executable by processor 110 or any other component in system 100. For example, software 120 may be a graphics device driver. Software 120 may include error handling routine 122, as further described below. Non-volatile storage 130 may be any type of non-volatile storage, such as a magnetic disk or solid-state hard drive.

Storage structure 140 may represent any structure to store information, including data and/or instructions, in an information processing system, such as a register, a cache, or another type of memory structure. For example, storage structure 140 may represent a last level data cache memory in processor 110. Storage structure 140 may include data storage area 142 to store data or other information, redundant storage area 144, and parity storage structure 146 to store parity values generated by parity logic 150 based on the data or other information. Alternatively, parity storage area 146 may be included anywhere else in system 100. Data storage area 142, redundant storage area 144, and parity storage area 146 may include any type of individual storage elements, such as latches or flip-flops, to store bits of data.

Parity logic 150 may include any circuitry, logic, or other hardware to generate parity values to be used to detect errors in data. For example, parity logic 150 may include an exclusive NOR gate to generate a parity bit that would be set to a logical '1' value when the number of inputs having a logical '1' value is odd and set to a logical '0' value when the number of inputs having a logical '1' value is even. The check values may be single parity bits or multiple parity bits with parity calculated over any number of data bits. The parity value generation may be performed at any time relative to the execution of the instruction associated with the generation of the data value, fetching of the data value, and/or storing of the data value. For example, a parity value may be generated in parallel with the generation of the data value, before the data value is stored, or after the data value is stored.

Parity logic 150 may also include any circuitry, logic, or other hardware to use the generated parity values to detect errors in data values. Parity logic 150 may be implemented in dedicated circuitry, logic, or hardware or within circuitry, logic, or other hardware also capable of performing other functions, according to any other known approach, in whole or in part. For example, parity logic 150 may be included in a general purpose arithmetic-logic unit or any other execution unit 180 of processor 110.

Error storage space 160 may represent any type of information storage structure, such as a register, to store information regarding a parity error, such as information generated by parity logic 150, as further described below. Error event generator 162 may represent any circuitry or other hardware to generate an interrupt or other event in response to the loading or writing of information into error storage space 160.

Address mapping logic 170 may include any circuitry, logic, or other hardware for translating an address. For example, in an embodiment wherein storage structure 140 is a cache memory, address mapping logic 170 may translate a logical address of a cache line or row to a physical address of a cache line or row.

Figure 2:
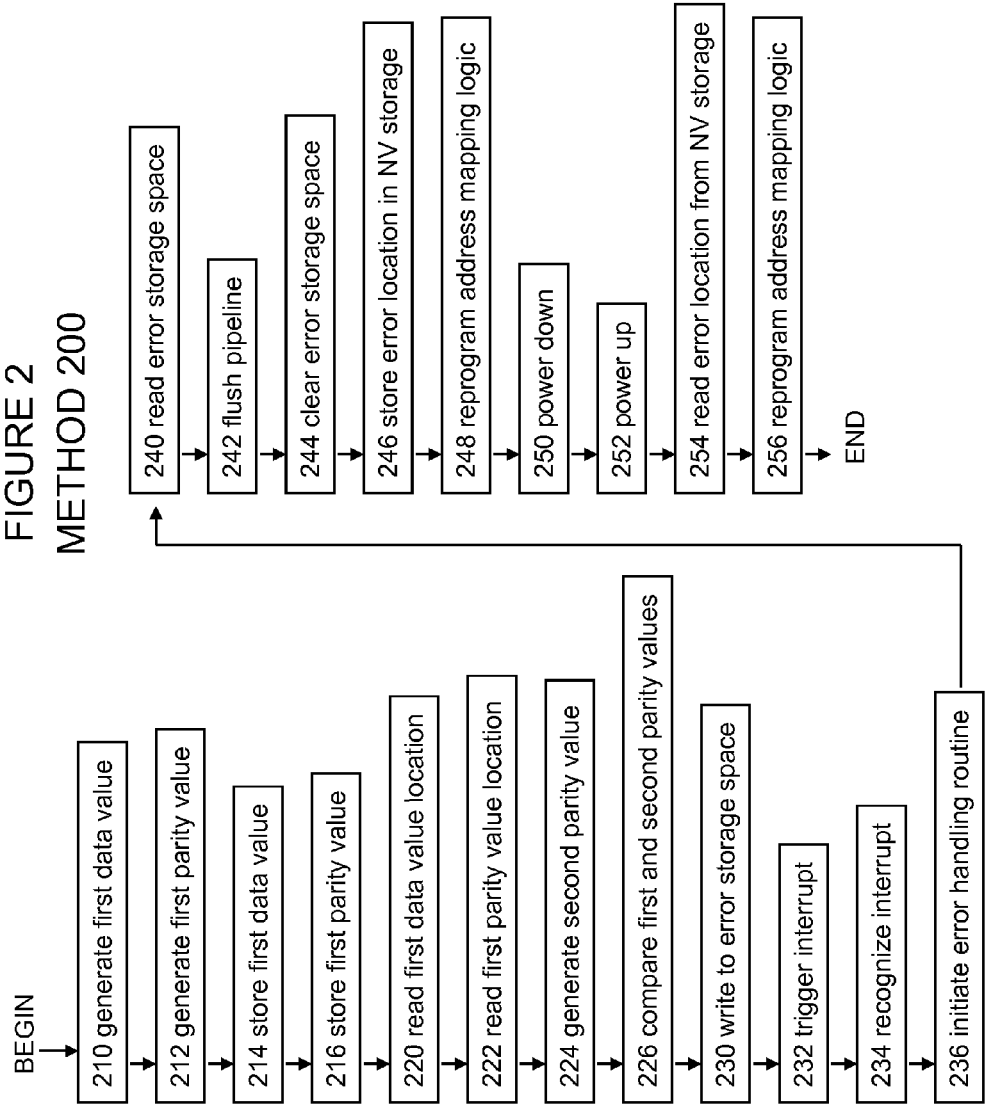
FIG. 2 illustrates a method for dynamic error handling according to an embodiment of the present invention.

FIG. 2 illustrates method 200 for dynamic error handling according to an embodiment of the present invention. Although method embodiments are not limited in this respect, reference may be made to elements of the embodiment of FIG. 1 in the description of the method embodiment of FIG. 2.

In box 210, a first data value of a first width is generated, fetched, or otherwise provided; for example, a byte of data may be generated by an execution unit such as execution unit 180 in processor 110. In box 212, a first parity value is generated, by parity logic 150, based on the first data value. In box 214, the first data value is stored in a first location in storage structure 140; for example, in a first row of a data storage area 142. In box 216, the first parity value is stored in a second location in storage structure 140; for example, in a location in parity storage area 146 corresponding to the first row of data storage area 142.

In box 220, the contents of the first location (where the first data value was stored) are read, for example, in connection with the execution, by execution unit 180, of an instruction requiring the first data value. In box 222, the contents of the second location (where the first parity value was stored) are read. In box 224, a second parity value is generated based on the contents of the first location. In box 226, the second parity value is compared to the contents of the second location (where the first parity value was stored). If they are equal, then no error has been detected in the contents of the first location (e.g., neither the contents of the first locations nor the second location have been changed by an error since the first data value and the first parity value were stored). If they are not equal, then an error has been detected in the contents of the first location (e.g., either the contents of the first location or the second location have been changed by an error since the first data value and the first parity value were stored), and method 200 continues in box 230.

In box 230, information regarding the detection of a parity error is stored in error storage space 160. The information stored may include the location of the error (e.g., the row or line of data storage area 142). In embodiments in which storage structure 140 in divided into banks, the location information may include a bank identifier, a sub-bank identifier, and a line identifier. In box 232, error event generator 162 recognizes the write to error storage space 160, triggering an interrupt or other event. In box 234, the interrupt is recognized. In box 236, error handling routine 122 is initiated in response to the interrupt.

In box 240, error handling routine 122 reads error storage space 160 to determine the location (e.g., the row) of the error. In box 242, error handling routine 122 may perform any operations needed or desired to handle and/or prevent propagation of the error, such as flushing or invalidating a pipeline in which the data read in box 222 may be used. In box 244, error handling routine 122 may clear error storage space 160 in order to prepare for the recognition of another error in data storage area 142. In box 246, error handling routine 122 stores the location of the error in non-volatile storage 130. In box 248, error handling routine 122 reprograms address mapping logic 170 to replace the location or row where the error was found with an unused location or row from redundant storage area 144. For example, address mapping logic 170 may be reprogrammed such that accesses to the location or row having the error are redirected to the location or row in redundant storage area 144.

In box 250, system 100 may be powered down. In box 252, system 100 may be powered up and the booting of system 100 may begin. In box 254, software 120 may read non-volatile storage 130 to determine the location of any previously found errors in data storage area 142. In box 256, software 120 may reprogram address mapping logic 170 to replace the location or row where the error was found with an unused location or row in redundant storage area 144, e.g., by redirecting accesses to the location or row where the error was found to the unused location or row in redundant storage area 144.

In method 200, information regarding an error is stored in non-volatile memory such that a location or row that has been found to contain an error can be replaced with a redundant row every time the system is booted. Therefore, memory locations that are susceptible to failure at low operating voltage are not used. However, it may be desirable to distinguish between soft errors and errors caused by low operating voltage.

FIG. 3 illustrates method 300 for distinguishing between soft errors and errors caused by low operating voltage according to an embodiment of the present invention. In box 310, error handling routine 122 is initiated in response to the detection of an error in data storage area 142, e.g., as in box 238 in method 200.

In box 320, error handling routine 122 reads error storage space 160 to determine the location (e.g., the row) of the error. In box 322, error handling routine 122 records the location of the error in an error log. In box 324, error handling routine 122 records the time of the detection of the error in an error log (e.g., using a timestamp based on the value of real-time clock 190). In box 326, error handling routine 122 may perform any operations needed or desired to handle and/or prevent propagation of the error, such as flushing or invalidating a pipeline in which the data read in box 222 may be used. In box 328, error handling routine 122 may clear error storage space 160 in order to prepare for the recognition of another error in data storage area 142.

In box 330, system 100 continues to operate for a predetermined time period, e.g., twelve hours. The length of the predetermined time period may be chosen based on any desired criteria, such as the environment in which system 100 and the desired level of error protection. In box 332, the predetermined time period expires without the detection of a second error at the same location as the location recorded in box 322. In box 334, the error log entry related to boxes 322 and 324 is cleared. Box 334 is performed based on the conclusion that the error was due to a soft error instead of low operating voltage, since the error did not re-occur within the predetermined time period. Therefore, the error may be ignored. If however, a second error does occur at the same location within the predetermined time period, then the second error may be handled according to boxes 246 and 248.

Within the scope of the present invention, the methods illustrated in FIGS. 2 and 3 may be performed in a different order, with illustrated boxes omitted, with additional boxes added, or with a combination of reordered, omitted, or additional boxes. For example, boxes 214 and 216 may be performed simultaneously, and boxes 220 and 222; these are just a few of the variations to methods 200 and 300 that are possible.

Thus, embodiments of an invention for dynamic error handling have been described. While certain embodiments have been described, and shown in the accompanying drawings, it is to be understood that such embodiments are merely illustrative and not restrictive of the broad invention, and that this invention not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:

1. A method comprising:
    detecting, by hardware in a processor, a first parity error in a first location in a cache in the processor;
    writing, by the hardware, the first location in an error register in the processor;
    triggering, by the hardware, a first interrupt to error handler software in response to the writing to the error register;
    reading, by the error handler software in response to the first interrupt, the first location from the error register;
    recording, by the error handler software, the first location in an error log;
    recording, by the error handler software, a timestamp of the first parity error in the error log, the timestamp provided by a real-time clock;
    clearing the error log if a predetermined time period has expired without detecting a second parity error in the first location;
    detecting, by the hardware in the processor, the second parity error in the first location in the cache in the processor;
    writing, by the hardware, the first location in the error register in the processor;
    triggering, by the hardware, a second interrupt to the error handler software in response to the writing to the error register;
    reading, by the error handler software in response to the second interrupt, the first location from the error register;
    reprogramming, by the error handler software if the predetermined amount of time has not expired since detecting the first parity error in the first location, address mapping hardware in the processor to redirect accesses to the first location to a second location in a redundant storage area in the cache;
    storing, by the error handler software if the predetermined amount of time has not expired since detecting the first parity error in the first location, the first location in a non-volatile memory;
    powering down the processor;
    powering up the processor; and
    reading the non-volatile memory; and
    reprogramming, if the first location is read from the non-volatile memory, the address mapping hardware in the processor to redirect accesses to the first location to the second location in the redundant storage area in the cache.

2. A system comprising:
    non-volatile storage;
    a processor including
        a cache to store a plurality of data values,
        parity hardware to detect a first parity error and a second parity error in a first location in the cache,
        an error register in which to write the first location in response to detection of the first parity error and in response to detection of the second parity error,
        interrupt generator hardware to generate a first interrupt in response to detection of the first parity error causing the first location to be written into the error register and to generate a second interrupt in response to detection of the second parity error causing the first location to be written into the error register, and
        address mapping hardware to be reprogrammed to replace the first location with a second location in a redundant storage area in the cache if the second parity error is detected in the first location within a predetermined time period since detection of the first parity error in the first location or if the first location is read from the non-volatile memory in response to powering up the processor;
    a real-time clock to provide a timestamp of the first parity error; and
    error handler software to respond to the first interrupt by reading the first location from the error register, recording the first location in an error log, and recording the timestamp of the first parity error in the error log, to clear the error log if the predetermined time period expires without detecting a second parity error in the first location, and to respond to the second interrupt by reading the first location from the error register, reprogramming the address mapping hardware to redirect accesses to the first location to a second location in the redundant storage area in the cache if the predetermined amount of time has not expired since detecting the first parity error in the first location, and storing the first location in the non-volatile storage if the redetermined amount of time has not expired since detecting the first parity error in the first location.

3. The system of claim 2, wherein the cache includes a data storage area to store the plurality of data values, and a parity storage area to store a plurality of parity values, each of the plurality of parity values corresponding to one of the plurality of data values.

4. The system of claim 3, wherein the parity hardware is also to generate the plurality of parity values.

* * * * *